(12) United States Patent
Choi et al.

(10) Patent No.: US 8,933,626 B2
(45) Date of Patent: Jan. 13, 2015

(54) FLEXIBLE DISPLAY PANEL, DISPLAY DEVICE HAVING THE DISPLAY PANEL, AND METHOD OF MANUFACTURING THE DISPLAY PANEL

(71) Applicants: Sang-Hyun Choi, Yongin (KR); Kyu-Seok Kim, Yongin (KR); Young-Nam Yun, Yongin (KR); Hyun-Koo Lee, Yongin (KR); Jung-Mi Jang, Yongin (KR)

(72) Inventors: Sang-Hyun Choi, Yongin (KR); Kyu-Seok Kim, Yongin (KR); Young-Nam Yun, Yongin (KR); Hyun-Koo Lee, Yongin (KR); Jung-Mi Jang, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 134 days.

(21) Appl. No.: 13/667,000

(22) Filed: Nov. 2, 2012

(65) Prior Publication Data

US 2013/0342429 A1    Dec. 26, 2013

(30) Foreign Application Priority Data

Jun. 26, 2012    (KR) .......................... 10-2012-0068708

(51) Int. Cl.
  *H01J 1/62*    (2006.01)
  *H01J 63/04*    (2006.01)
  *H05K 13/00*    (2006.01)

(52) U.S. Cl.
  CPC ..................................... *H05K 13/00* (2013.01)
  USPC ............................... 313/511; 313/512; 445/24

(58) Field of Classification Search
  CPC ....... G09G 3/00; G09G 2380/02; H05K 13/00; H05K 3/10; G06F 1/1652; H01L 2251/5338; G02F 1/133305; H04M 1/0268
  USPC ............. 313/511, 512, 498, 504; 427/162, 66
  See application file for complete search history.

(56) References Cited

U.S. PATENT DOCUMENTS

| | | | |
|---|---|---|---|
| 2008/0211733 A1* | 9/2008 | Huitema ......................... | 345/3.1 |
| 2010/0033451 A1* | 2/2010 | Shinn et al. .................... | 345/204 |
| 2010/0096633 A1 | 4/2010 | Hatano et al. | |
| 2011/0050604 A1 | 3/2011 | Kwon et al. | |
| 2011/0050657 A1 | 3/2011 | Yamada | |
| 2011/0143079 A1 | 6/2011 | Lee | |
| 2011/0176260 A1* | 7/2011 | Walters et al. ........... | 361/679.01 |
| 2013/0002583 A1* | 1/2013 | Jin et al. ........................ | 345/173 |

FOREIGN PATENT DOCUMENTS

| | | |
|---|---|---|
| JP | 2011-3522 A | 1/2011 |
| JP | 2011-47976 A | 3/2011 |
| KR | 10-2011-0024531 A | 3/2011 |
| KR | 10-2011-0068176 A | 6/2011 |

OTHER PUBLICATIONS

Korean Office Action Dated Mar. 12, 2014.

* cited by examiner

*Primary Examiner* — Anh Mai
*Assistant Examiner* — Glenn Zimmerman
(74) *Attorney, Agent, or Firm* — Lee & Morse, P.C.

(57) ABSTRACT

A flexible display panel includes a non-flexible first substrate in a first display area, a flexible second substrate in a second display area, a light emitting unit on a side of the first and second substrates, and a thin film encapsulation member on the light emitting unit.

20 Claims, 12 Drawing Sheets

FLEXIBLE DISPLAY PANEL, DISPLAY DEVICE HAVING THE DISPLAY PANEL, AND METHOD OF MANUFACTURING THE DISPLAY PANEL

CROSS-REFERENCE TO RELATED APPLICATION

This application claims the benefit under 35 U.S.C. §119 of Korean Patent Application No. 10-2012-0068708, filed on Jun. 26, 2012, in the Korean Intellectual Property Office, the disclosure of which is incorporated herein in its entirety by reference.

BACKGROUND

1. Field

Embodiments relate to a flexible display panel and a method of manufacturing the same.

2. Description of the Related Art

Recently, flexible displays are gaining huge popularity as a new technology in the display field. Flexible displays are implemented on a thin bending substrate, such as a substrate formed of plastic, and thus may not be damaged even by being folded or rolled like paper. Currently, flexible displays are implemented by employing a liquid crystal display (LCD) having thin film transistors (TFTs), an organic light emitting display (OLED), etc. A protective layer and plastic are coated on a supporting substrate, such as glass, on which a process of forming the display element is performed. Then, an encapsulation process is performed thereon to prevent moisture and air permeation. A protective film is attached onto the encapsulation member and then the supporting substrate is removed.

SUMMARY

Embodiments are directed to a flexible display panel including a non-flexible first substrate in a first display area, a flexible second substrate in a second display area, a light emitting unit on a side of the first and second substrates, and a thin film encapsulation member on the light emitting unit.

The first display area may have a flat shape. The second display area may have a curved shape with a predetermined curvature from a boundary with the first display area toward the first substrate.

The first display area may have a flat shape, and the second display area may have a flat shape, the second display area being at a predetermined angle from a boundary with the first display area toward the first substrate.

The first display area may further include a transparent electrode pattern on another side of the first substrate.

The first display area may have a flat shape, and the second display area may have a curved shape with a predetermined curvature from a boundary with the first display area toward a side away from the first substrate.

The first display area may have a flat shape, and the second display area may have a flat shape, the second display area being folded at a predetermined angle from a boundary with the first display area toward a side away from the first substrate According to embodiments, there is provided a flexible display panel including a first display area including a non-flexible first substrate, a first light emitting unit on a side of the first substrate, and a first thin film encapsulation member on the first light emitting unit, and a second display area including a flexible second substrate, a second light emitting unit on a side of the second substrate, and a second thin film encapsulation member on the second light emitting unit.

The second substrate may be formed at a same level as the first light emitting unit.

The first display area may have a flat shape, and the second display area may have a curved shape with a predetermined curvature from a boundary with the first display area toward the first substrate.

The first display area may have a flat shape, and the second display area may have a flat shape, the second display area being folded at a predetermined angle from a boundary with the first display area toward the first substrate.

The first display area may further include a transparent electrode pattern on another side of the first substrate.

The first display area may have a first flat shape, and the second display area may have a curved shape with a predetermined curvature from a boundary with the first display area toward a side away from the first substrate, or may have a second flat shape and is folded at a predetermined angle from the boundary with the first display area toward the side away from the first substrate.

The first thin film encapsulation member may be thicker than the second thin film encapsulation member, with the first and second thin film encapsulation members being flat without any step height therebetween.

Embodiments are also directed to a display device including a flexible display panel having a non-flexible first substrate in a first display area, a flexible second substrate in a second display area, a light emitting unit on a side of the first and second substrates, and a thin film encapsulation member on the first light emitting unit, and a supporting member to support the shape of the flexible display panel.

The first display area may have a flat shape, and the second display area may have a curved shape with a predetermined curvature from a boundary with the first display area toward the first substrate, or may have a second flat shape and may be folded at a predetermined angle from the boundary with the first display area toward the first substrate.

The first display area may further include a transparent electrode pattern on another side of the first substrate, and a third substrate that covers the transparent electrode pattern and forms a touch screen.

The first display area may have a first flat shape, and the second display area may have a curved shape with a predetermined curvature from a boundary with the first display area toward a side away from the first substrate, or may have a second flat shape and may be folded at a predetermined angle from the boundary with the first display area toward the side away from the first substrate.

Embodiments are also directed to a method of manufacturing a display device including selectively forming a flexible substrate on one side of a supporting substrate, forming a light emitting unit having light emitting devices on the supporting substrate, both in an area in which the flexible substrate is not formed, and on the flexible substrate, forming a thin film encapsulation member that encapsulates the light emitting unit, and separating a part of the supporting substrate in an area in which the flexible substrate is formed from the flexible substrate.

The method may further include forming a transparent electrode pattern on another side of the supporting substrate in an area in which the flexible substrate is not to be formed, before forming the flexible substrate.

The method may further include curving the second display area with a predetermined curvature or folding the second display area at a predetermined angle, from a boundary between a first display area in which the flexible substrate is not formed and a second display area in which the flexible substrate is formed

BRIEF DESCRIPTION OF THE DRAWINGS

Features will become more apparent by describing in detail exemplary embodiments thereof with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. Like numbers refer to like elements throughout.

It will be understood that although the terms first and second are used herein to describe various elements, these elements should not be limited by these terms. These terms are only used to distinguish one element from another element. Thus, a first element discussed below could be termed a second element, and similarly, a second element may be termed a first element without departing from the teachings of this disclosure.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the drawings in connection with embodiments, for the purpose of clarity, thicknesses of some layers or areas may be exaggerated. When an element or layer is referred to as being "on" another element or layer, the element or layer can be interpreted not only to be "directly on" another element, but also to have intervening elements or layers therebetween.

Structures and operations will now be described in detail with reference to embodiments, which are illustrated in the accompanying drawings.

Figure 1:
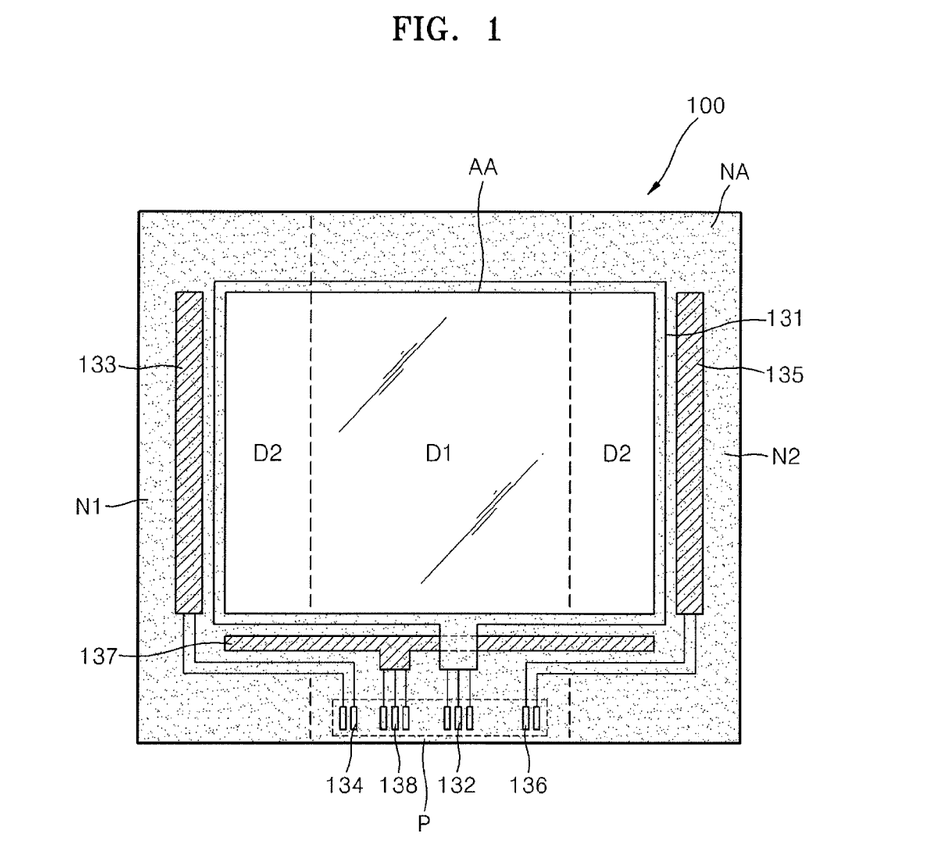
FIG. 1 is a plan view of a flexible display panel, according to an embodiment.
Figure 2:
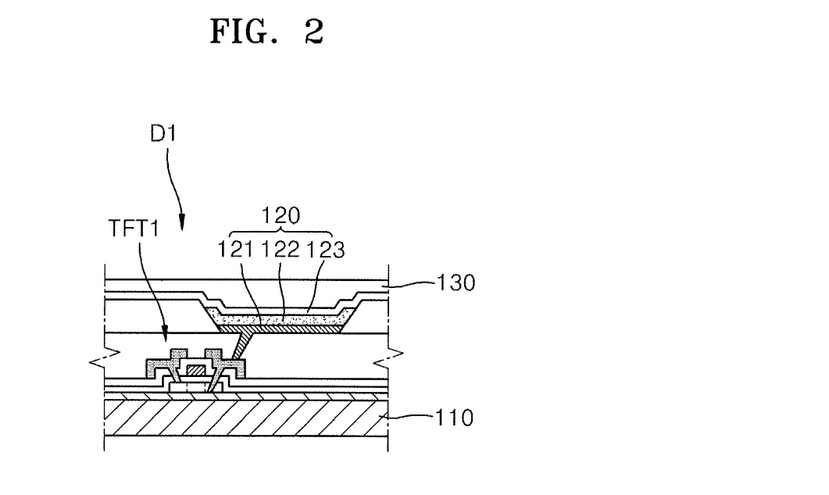
FIGS. 2 and 3 are cross-sectional views of examples of physical structures of pixels in a display area of FIG. 1.
Figure 3:
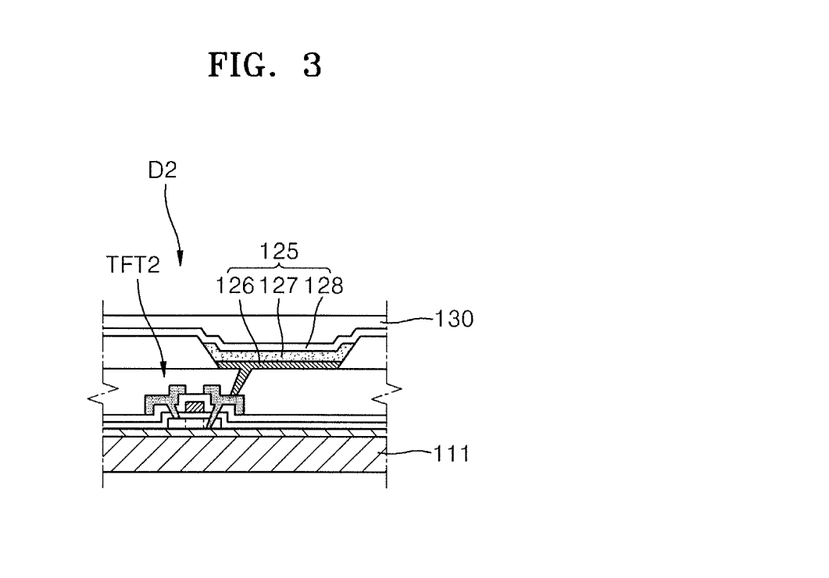

FIG. 1 is a plan view of a flexible display panel 100, according to an embodiment. FIGS. 2 and 3 are cross-sectional views of examples of physical structures of pixels in a display area AA of FIG. 1.

Referring to FIG. 1, the flexible display panel 100 includes a display area AA providing images and a non-display area NA surrounding the display area AA. The display area AA may be divided into two or more areas, each of which may be a flexible area or a non-flexible area, depending on the selective removal of a supporting substrate. In the current embodiment, the display area AA includes a first display area D1, and second display areas D2 disposed on left and right sides of the first display area D1. On the display area AA and the non-display area NA, there may be a thin film encapsulation member 130.

The first display area D1 is maintained substantially flat and may be a main display screen of the display panel 100.

FIG. 2 is an example of a physical structure of a pixel in the first display area D1. Referring to FIG. 2, the pixel in the first display area D1 may have at least one of an organic light emitting diode (OLED), a liquid crystal device (LCD), or an electrophoretic device, etc. disposed on a glass substrate 110, which is non-flexible. In the current embodiment, the OLED 120 will be taken as an example. The OLED 120 includes a pixel electrode 121, a counter electrode 123, and an organic light emitting layer 122 between the pixel electrode 121 and a counter electrode 123. The OLED 120 is electrically connected to at least one thin film transistor TFT1 and a storage capacitor (not shown) to emit light from the first display area D1. The first display area D1 is formed on the glass substrate 110, which is non-flexible. Light emitted from the organic light emitting layer 122 in the first display area D1 may be radiated toward the glass substrate 110 or toward the thin film encapsulation member 130.

The second display areas D2 may be disposed by being extended from both sides of the first display area D1 and by being folded in left and right directions of the first display area D1, serving as sub-display screens.

FIG. 3 is an example of a physical structure of a pixel in the second display areas D2. Referring to FIG. 3, the pixel in the second display areas D2 may have at least one organic light emitting diode (OLED), a liquid crystal device (LCD), an electrophoretic device, etc. disposed on a flexible substrate 111. In the embodiment, the OLED 125 will be taken as an example. The OLED 125 includes a pixel electrode 126, a counter electrode 128, and an organic light emitting layer 127 between the pixel electrode 126, a counter electrode 128. The OLED 125 is electrically connected to at least one TFT 2 and a storage capacitor (not shown) to emit light from the second display area D2. The second display area D2 is a flexible area with the glass substrate 110 removed. Light emitted from the organic light emitting layer 127 in the second display area D2 may be radiated toward the flexible substrate 111 or toward the thin film encapsulation member 130.

The OLED 120, TFT1, and storage capacitor of the first display area D1 may be formed at the same time as are the OLED 125, TFT2, and storage capacitor of the second display area D2.

Referring back to FIG. 1, the non-display area NA is disposed outside the first and second display areas D1 and D2. Parts N1 and N2 of the non-display area disposed outside the second display area D2 may also be formed on the flexible substrate 111 as is the second display area D2. Remaining parts other than N1 and N2 of the non-display area NA may also be formed on the glass substrate 110 as is the first display area D1. In other implementations, the entire non-display area NA may be formed on the flexible substrate 111 as is the second display area D2.

In the non-display area NA, many different circuits and wires are disposed for providing image signals to display elements located in the display area AA. In the non-display area NA, an electrode power supply line 131 for supplying electric power to the counterpart electrodes 123 and 128, a scanning circuit 133 for delivering driving signals to the display area AA, a data circuit 135 for delivering data signals to the display area AA, and a driving power wired unit 137 for supplying electric driving power to the display area AA are disposed. In the non-display area NA, a pad (P) having terminals 132 of the electrode power supply line 131, terminals 134 of the scanning circuit 133, terminals 136 of the data circuit 135, and terminals of the driving power wired unit 137, is disposed.

In the embodiment, the first display area D1 and the second display area D2 receive image signals from the same electrode power supply line 131, scanning circuit 133, data circuit 135 and the driving power wired unit 137. In other words, the first display area D1 and the second display area D2 display image signals that are input though the same image signal input unit. Thus, the first display area D1 and the second display areas D2 may operate together as a single display screen.

In other implementations, the first and second display areas D1 and D2 may display different image signals input though different image signal input units, respectively.

FIGS. 4 through 9 are cross-sectional views schematically illustrating a process of manufacturing the flexible display panel, according to an embodiment. The flexible display panel of FIGS. 4 to 9 is an example of the display panel 100, shown in FIG. 1, with the non-display area NA being omitted and only the display area being shown.

Figure 4:
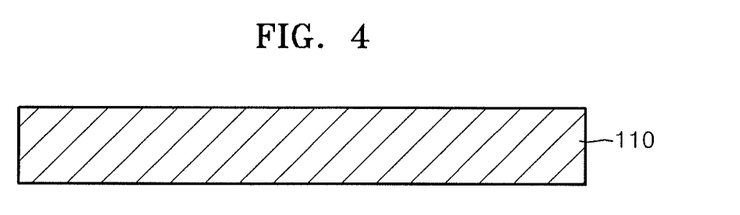
FIGS. 4 through 9 are cross-sectional views schematically illustrating a process of manufacturing the flexible display panel, according to an embodiment.

Referring to FIG. 4, the substrate 110 (also referred to as a supporting substrate) is prepared. The supporting substrate 110 may be a glass substrate, for example. In other implementations, various other types of suitable substrates, such as transparent plastic or metal substrates that can support the flexible substrate 111 and endure process stress during the process of forming elements and wires on the flexible substrate 111, may be selected.

Figure 5:
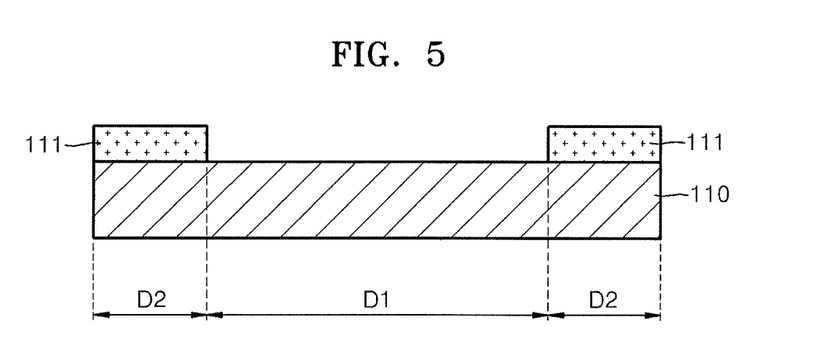

Referring to FIG. 5, the flexible substrate 111 is formed selectively on one side of the supporting substrate 110. The flexible substrate 111 is disposed on all areas except for areas in which the supporting substrate 110 will remain. In the embodiment, the flexible substrate 111 is not formed on the supporting substrate 110 in the first display area D1, but is only formed on the supporting substrate 110 in the second display areas D2. Although not shown, the flexible substrate 111 may be formed on all or parts of the non-display area NA. The flexible substrate 111 shows superior thermostability and durability characteristics, and is made of plastic having superior thermostability and durability, such as polyethylene terephthalate, polyethylene naphthalate, polycarbonate, polyarylate, polyetherimide, polyethersulfone, and polyimide. Other various flexible materials may be used.

Although not shown in FIG. 5, a separation layer (not shown) may be formed between the supporting substrate 110 and the flexible substrate 111. The separation layer may be formed of various materials. It is desirable that the separation layer be formed of a material beneficial to a separation process.

Furthermore, although not shown in FIG. 5, barrier films may further be formed on the supporting substrate 110 and the flexible substrate 111. The barrier films may be formed of one or more inorganic and organic films. The barrier films prevent undesirable elements from penetrating the supporting substrate 110 and the flexible substrate 111 to reach the display area AA.

Figure 6:
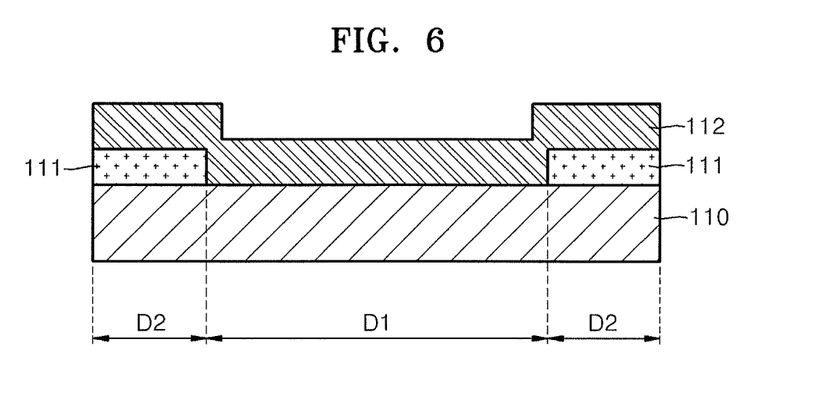

Referring to FIG. 6, on the supporting substrate 110 and the flexible substrate 111, the light emitting unit 112 is formed. Specifically, the light emitting unit 112 includes in the first display area D1 the organic light emitting device 120, the TFT1, (and the storage capacitor), as shown in FIG. 2, and includes in the second display area D2 the organic light emitting device 125, the TFT2, (and the storage capacitor), as shown in FIG. 3. The light emitting unit 112 is simultaneously formed in the first and second display areas D1 and D2. Since, in the second display area D2, the flexible substrate 111 is formed on the supporting substrate 110, the flexible substrate 111 is positioned on the same level with the light emitting unit 112 of the first display area D1 and thus, a step height occurs between the first and second display areas D1 and D2.

Figure 7:
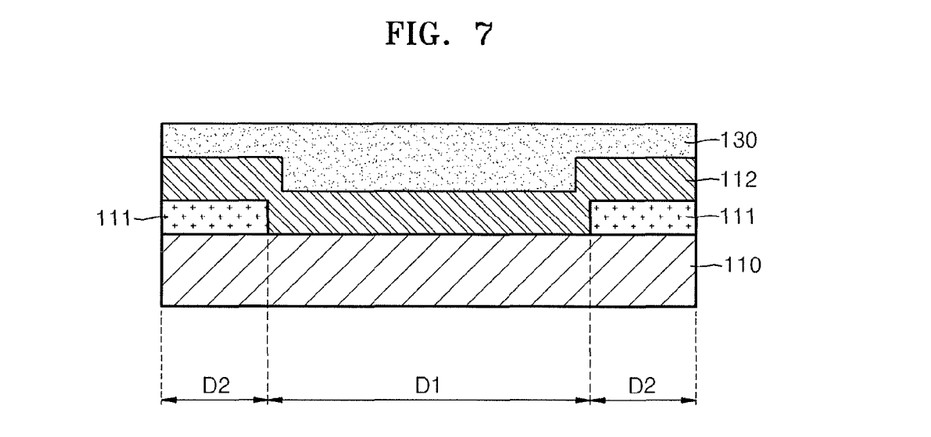

Referring to FIG. 7, the thin film encapsulation member 130 is formed over the supporting substrate 110 and the flexible substrate 111 to cover the light emitting unit 112. The thin film encapsulation member 130 may have a structure in which organic and/or inorganic layers are repeatedly deposited one or more times. As another example, the thin film encapsulation member 130 in the form of a film may be formed on the light emitting unit 112 in various ways, such as via vacuum deposition, or via adhesion with an adhesive. Although not shown in FIG. 7, a protective film may further be attached onto the thin film encapsulation 130.

When the thin film encapsulation member 130 is formed thicker in the first display area D1 than in the second display area D2, the first and second display areas D1 and D2 may be formed to be level with each other without any step height.

Figure 8:
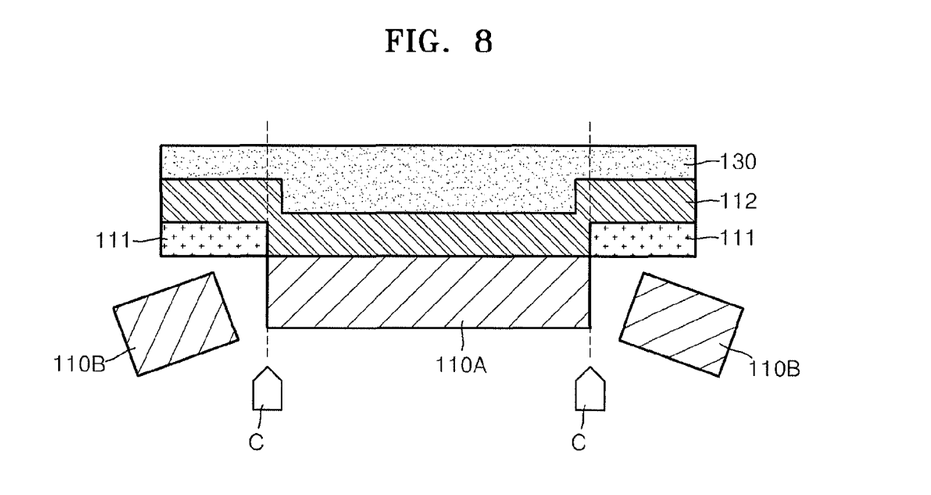

Referring to FIG. 8, parts of the supporting substrate 110 that correspond to the second display areas D2 are separated from the flexible substrate 111. As a result, a part 110A of the supporting substrate 110 that corresponds to the first display area D1 remains the same, while parts 110B of the supporting substrate 110 that correspond to the second display areas D2 are removed.

Separating the parts 110B of the supporting substrate 110 that correspond to the second display areas D2 may be achieved using various methods. For example, by cutting the supporting substrate 110 with a cutter C, the parts 110B of the supporting substrate 110 may be separated. In a case where the separation layer exists between the supporting layer 110 and the flexible layer 111, together with the cutting process, an additional process, such as laser beam radiation or chemical melting, may be used to separate the parts 110B that correspond to the second display area D2.

Figure 9:
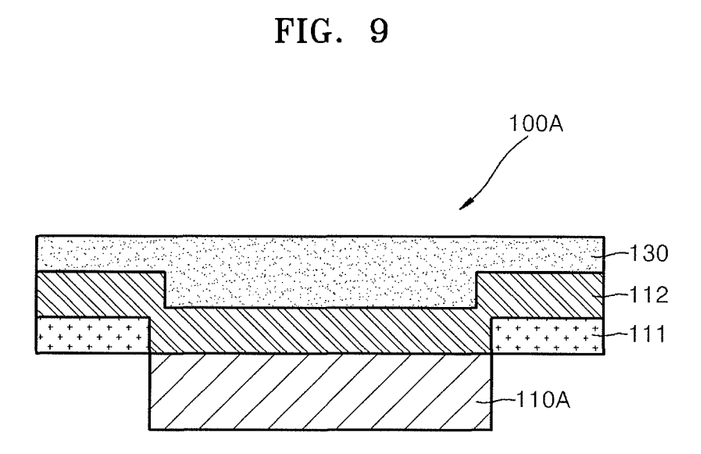

FIG. 9 shows the flexible display panel 100A with parts 110B of the supporting substrate 110 that correspond to the second display area D2 removed. Although not shown, a protective film may further be attached onto the flexible substrate 111 of the flexible display panel 100A, after the parts 110B of the supporting substrate 110 has been separated from the flexible substrate 111. After the separation process, a polarizer (not shown) may be attached onto the thin film encapsulation member 130.

The flexible display panel 100A prepared according to the foregoing processes may be positioned in a housing of the display device by folding or bending the second display area D2 at a predetermined angle or curvature.

Figure 10:
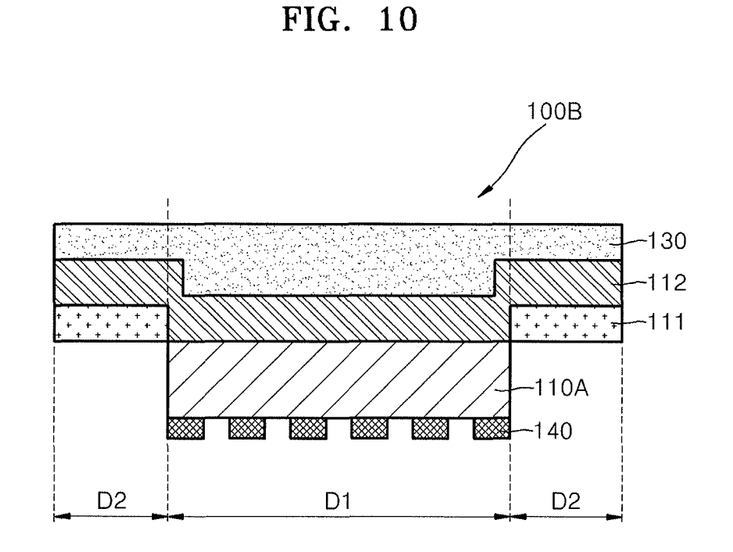
FIG. 10 is a cross-sectional view of the flexible display panel, according to an embodiment.

FIG. 10 is a cross-sectional view of the flexible display panel 100B, according to an embodiment.

Referring to FIG. 10, the flexible display panel 100B is an another example of the display panel 100, shown in FIG. 1, with only the display area AA shown while omitting the non-display area NA. Although not shown, the flexible display panel 100B is divided into the display area AA and the non-display area NA surrounding the display area AA. The display area AA includes a first display area D1, and second display areas D2 disposed on the left and right of the first display area D1. The flexible display panel 100B is distinguished from the flexible display panel 100A, shown in FIG. 9, in that transparent electrode patterns 140 are further included in the first display area D1 of the supporting substrate 110A. The first display area D1 of the flexible display panel 100B may be a touch screen.

FIGS. 11 through 15 are cross-sectional views schematically illustrating a process of manufacturing the flexible display panel, according to an embodiment. Compared with FIGS. 4 to 9, descriptions of overlapping parts in FIGS. 11 to 15 will not be repeated.

Figure 11:
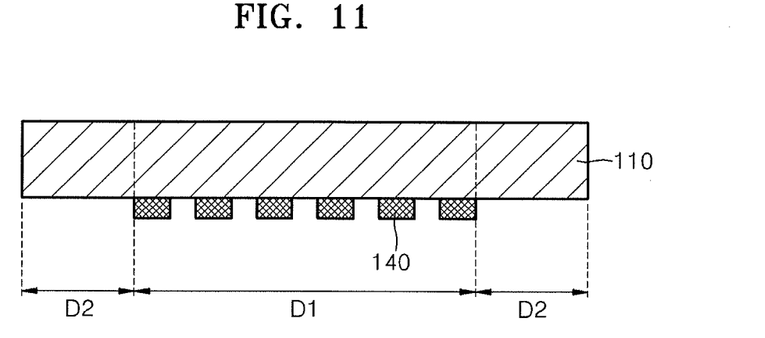
FIGS. 11 through 15 are cross-sectional views schematically illustrating a process of manufacturing the flexible display panel, according to another embodiment.

Referring to FIG. 11, firstly, a transparent electrode pattern 140 for forming a touch screen is formed on a side of the supporting substrate 110 in the first display area D1. To do this, a transparent electrode layer is formed on the side of the supporting substrate 110, part of the transparent electrode layer over the second display area D2 is removed, and the remaining transparent electrode layer is patterned to form a certain pattern of electrodes only in the first display area D1. The transparent electrode layer may be formed of a transparent conductive material, such as ITO, IZO, ZnO, or $In_2O_3$.

Figure 12:
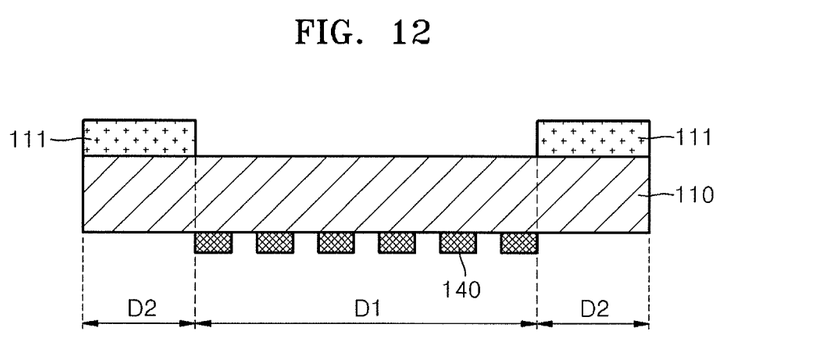

Referring to FIG. 12, on the other side of the supporting substrate 110, the flexible substrate 111 is selectively formed. The flexible substrate 111 is disposed on all areas except for areas in which the supporting substrate 110 will remain. In the current embodiment, the flexible substrate 111 is not formed on the supporting substrate 110 in the first display area D1, but only formed on the supporting substrate 110 in the second display areas D2. Although not shown, the flexible substrate 111 is also formed on all or parts of the non-display area NA. Although not shown in FIG. 12, a separation layer (not shown) may be formed between the supporting substrate 110 and the flexible substrate 111. Furthermore, although not shown in FIG. 12, barrier films may further be formed on the supporting substrate 110 and the flexible substrate 111.

Figure 13:
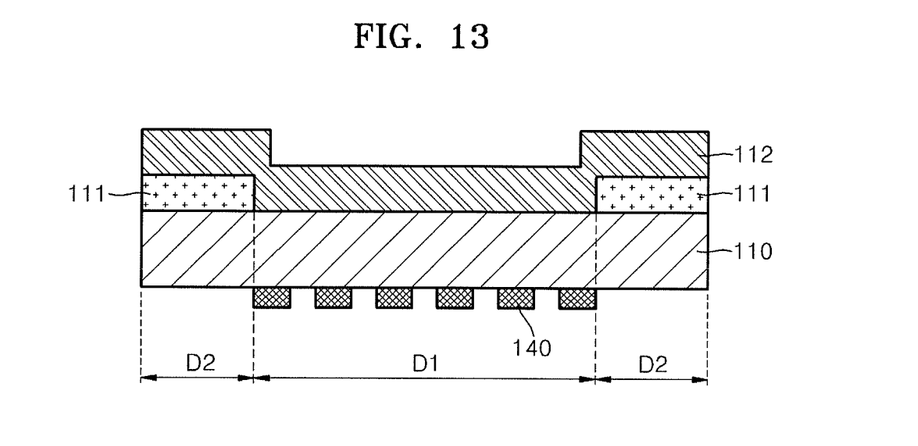

Referring to FIG. 13, on the supporting substrate 110 and the flexible substrate 111, the light emitting unit 112 is formed. Specifically, the light emitting unit 112 includes in the first display area D1 the organic light emitting device 120, the TFT1, (and the storage capacitor), as shown in FIG. 2, and includes in the second display area D2 the organic light emitting device 125, the TFT2, (and the storage capacitor), as shown in FIG. 3.

Figure 14:
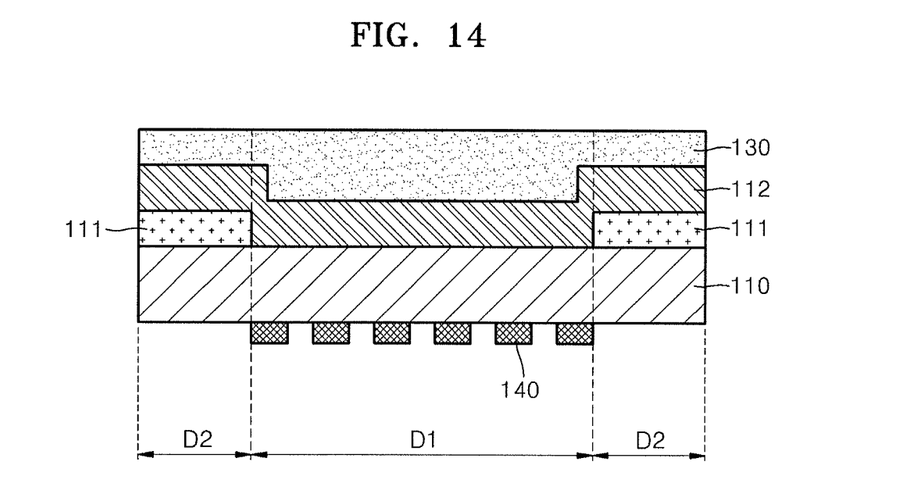

Referring to FIG. 14, the thin film encapsulation member 130 is formed over the supporting substrate 110 and the flexible substrate 111 to cover the light emitting unit 112. The thin film encapsulation member 130 may have a structure in which organic and/or inorganic layers are repeatedly deposited more than one time on the light emitting unit 112, or may be formed in the form of a film on the light emitting unit 112 in various ways, such as via vacuum deposition, or via adhesion with an adhesive. Although not shown in FIG. 14, a protective film may further be attached onto the thin film encapsulation member 130.

Figure 15:
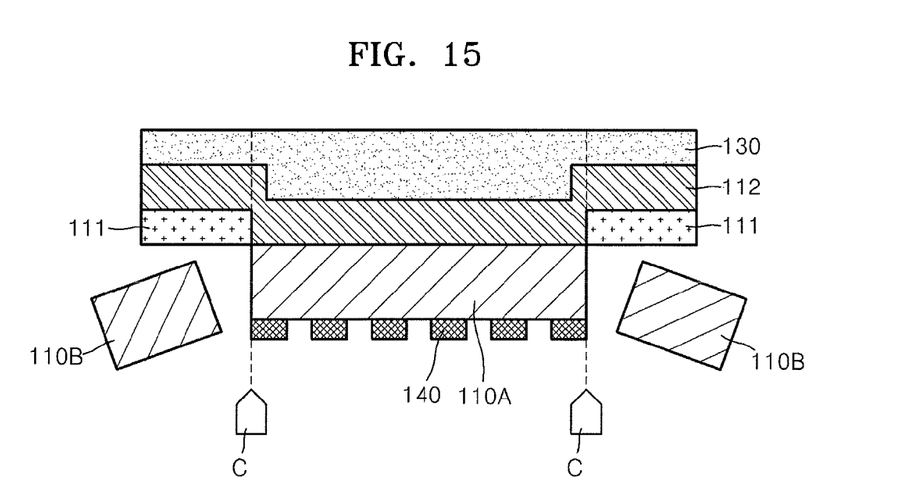

Referring to FIG. 15, parts of the supporting substrate 110 that correspond to the second display areas D2 are separated from the flexible substrate 111 via cutter cutting. As a result, the part 110A of the supporting substrate 110 that corresponds to the first display area D1 remains the same, while parts 110B of the supporting substrate 110 that correspond to the second display areas D2 are removed. In the case that the separation layer exists between the supporting layer 110 and the flexible layer 111, together with the cutting process, an additional process, such as laser beam radiation, chemical melting, etc. may be performed.

Although not shown, a protective film may further be attached onto the flexible substrate 111 of the flexible display panel 100B, after the parts 110B of the supporting substrate 110 have been removed from the flexible substrate 111. After the separation process, a polarizer (not shown) may be attached onto the thin film encapsulation member 130.

The flexible display panel 100B prepared according to the foregoing processes may be positioned in a housing of the display device by folding or bending the second display area D2 at a predetermined angle or curvature.

FIGS. 16 to 20 illustrate a mounting form used to position the flexible display panel 200 in a housing, according to an embodiment. The flexible display panel 200 is in an exemplary mounting form to position the flexible display panel 100A, shown in FIGS. 1 and 9, in the housing.

Figure 16:
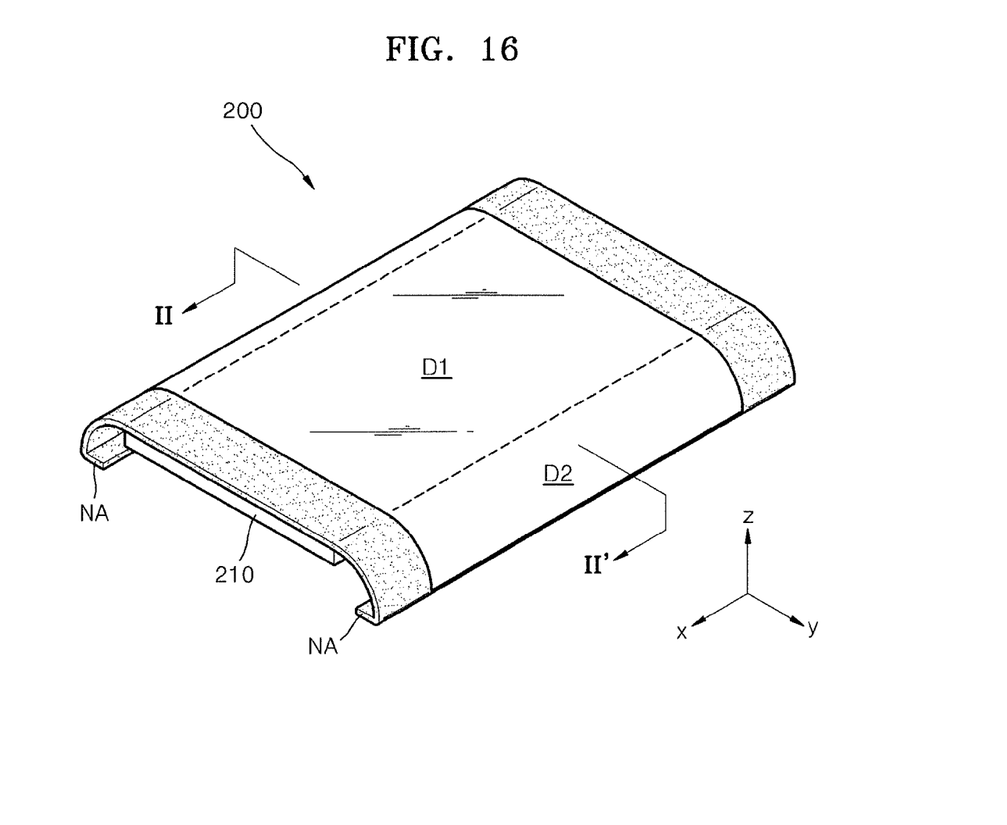
FIGS. 16 through 20 illustrate a mounting form used to position the flexible display panel in a housing, according to an embodiment.
Figure 17:
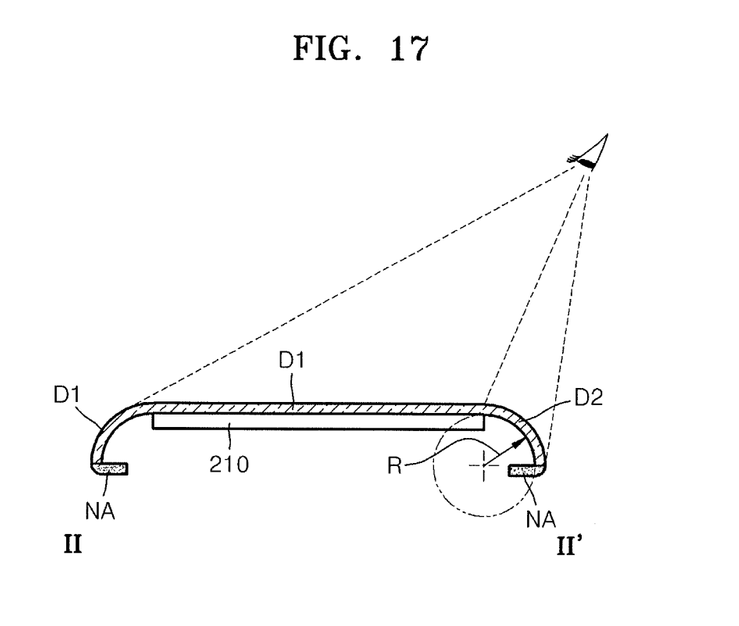

Referring to FIGS. 16 and 17, the first display area D1 formed on a glass substrate 210 substantially remains flat. The first display area D1 may be a main display screen of the flexible display panel 200. In the first display area D1, a light emitting unit and an encapsulation member are formed on the glass substrate 210.

The second display areas D2 seamlessly border the first display area D1 and extend from lateral sides of the first display area D1. The second display areas D2 may be formed on the flexible substrate with the glass substrate removed, and thus may be a sub-display screen of the flexible display panel 200. In the second display areas D2, a light emitting unit and an encapsulation member are formed on the flexible substrate. The second display areas D2 are bent from the border with the first display area D1 to have a curved shape with a predetermined radius R of curvature. For example, the predetermined radius R of curvature may range from 0.01 mm to 20 mm. If the radius R of curvature is less than 0.01 mm, the second display area D2 may fail to keep itself curved due to bending stress, or otherwise, if the radius R is greater than 20 mm, comfort in terms of grip and/or an aesthetic sense of the device may be degraded. The radius R of curvature may have a constant value. Thus, the curved panel area may be a part of a circumference. In this regard, the curved panel area may be formed to be less than a quarter of the circumference with a predetermined constant value of curvature. An angle from the border between the first display area D1 and the second display area D2 to an end of the second display area D2 may range from 0° (not inclusive) to 90°.

The flexible display panel 200 has the second display areas D2 extending from the first display area D1 and forming the curved shape with a certain radius of curvature. Accordingly, an image may be viewed by a user on the first display area D1 as well as on the extended display screen, i.e., the second display areas D2, leading to an expansion of the entire display screen.

If the flexible display panel 200 is provided in a small handheld display device, such as a cellular phone or a personal digital assistant (PDA), the comfort in terms of grip and the aesthetic sense of the display device may be improved because the second display areas D2 are formed as a curved shape.

Areas among the non-display areas NA that are located outside the second display areas D2 are folded from the second display area D2 toward the glass substrate 210. Thus, the non-display areas of the display device may be minimized.

The current embodiment shows an example of folding only the non-display areas disposed on lateral sides of the second display areas D2. In other implementations, such as in a case that all the non-display areas are formed on the flexible substrate, the opposite non-display areas along the x-axis to the first display area D1 may also be folded toward the glass substrate 210. This reduces the non-display area even further, thus resulting in a more expanded display screen.

Figure 18:
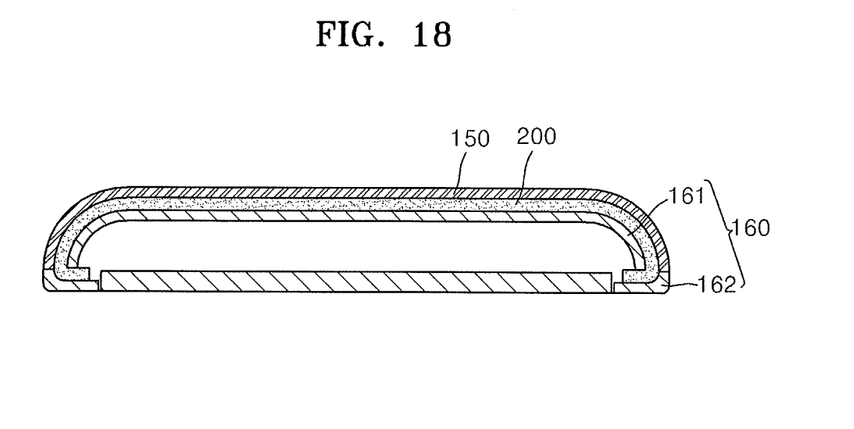
Figure 19:
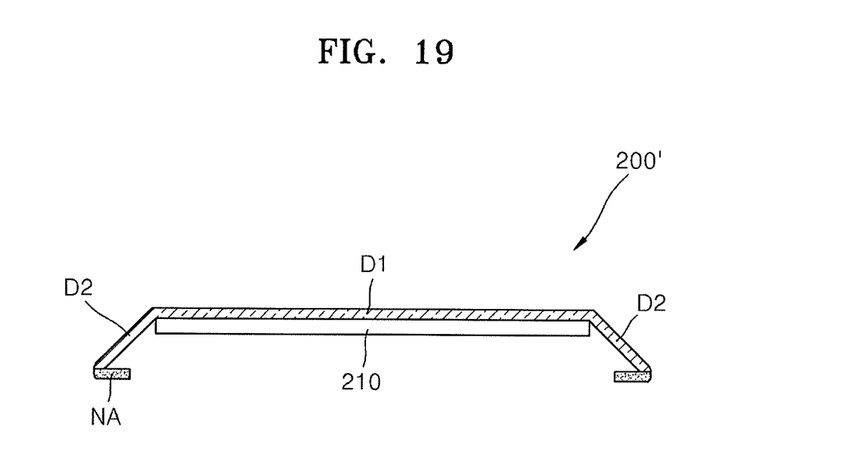

Referring to FIG. 18, the flexible display panel 200 is incorporated into the display device (not shown). The display device may include a frame or housing 160 to protect and support the display panel. The flexible display panel 200 of the embodiment is attached onto the top of the front case 161 of the housing 160, with the non-display area NA of the flexible display panel 200 being folded and safely received between the front case 161 and the bottom case 162 so as to prevent the non-display area NA from being viewed and recognized. The flexible display panel 200 may include a transparent protective window 150 thereon. The window 150 may act not only as a protector of the flexible display panel 200 from an outside shock, but also as a supporter to maintain the shape of the flexible display panel 200.

Figure 20:
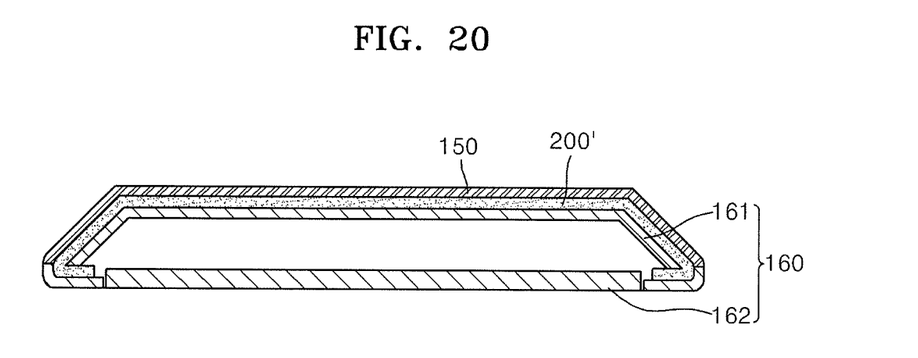

FIGS. 16 to 18 show the second display area D2 having a curved shape. In other implementations, as shown, for example, in FIG. 19, a display panel 200' may be formed such that the second display area D2 has a flat shape. From the border between the first display area D1 and the second display area D2, the second display area D2 may be folded at a predetermined angle toward the glass substrate 210, so as to have the flat shape. In this case, as shown in FIG. 20, the area in the front case 161 of the housing 160 that corresponds to the second display area D2 may also have the flat shape and support to maintain the shape of the display panel 200'.

FIGS. 21 through 24 illustrate another mounting form used to position the flexible display panel 300 in a housing) according to another embodiment. The flexible display panel 300 is an example of the mounting form used to position the flexible display panel 100B, shown in FIGS. 1 and 10, in the housing Referring to FIG. 21, the flexible display panel 300 includes the first display area D1 and the second display areas D2 that seamlessly border on the first display area D1 and extend from lateral sides of the first display area D1. The non-display area NA is formed around the first and second display areas D1 and D2.

Figure 21:
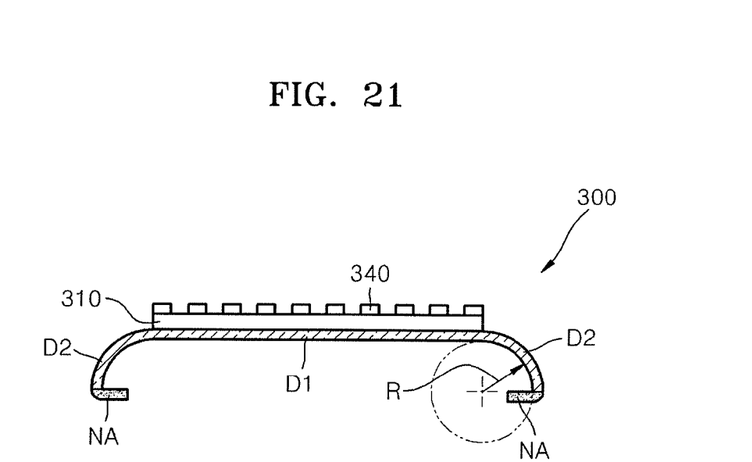
FIGS. 21 through 24 illustrate another mounting form used to position the flexible display panel in a housing, according to another embodiment.

The first display area D1 includes on the glass substrate 310 a light emitting unit and an encapsulation member, and on the bottom of the glass substrate 310 transparent electrode patterns are included. The first display area D1 substantially remains flat, and may serve as a main display screen of the flexible display panel 300.

The second display areas D2 may include a light emitting unit and the encapsulation member on the flexible substrate with the glass substrate 310 removed, and may serve as a sub-display screen of the flexible display panel 300. The second display areas D2 are bent from the border with the first display area D1 to be curved opposite to the glass substrate 310 with a predetermined radius of curvature R. As a result, the bottom of the glass substrate 310 is positioned at the front side of the mounting form. The predetermined radius R of curvature may range from 0.01 mm to 20 mm. If the radius R of curvature is less than 0.01 mm, the second display area D2 may fail to keep itself curved due to the bending stress, or otherwise, if the radius R is greater than 20 mm, the comfort in terms of grip and/or the aesthetic sense of the device may be degraded. The radius R of curvature may have a constant value. Thus, the curved panel area may be a part of a circumference. In this regard, the curved panel area may be formed to be less than a quarter of the circumference with a predetermined constant value of curvature. In other words, an angle from the border between the first display area D1 and the second display area D2 to the end of the second display area D2 may range from 0° (not inclusive) to 90°.

The flexible display panel 300 has the second display areas D2 extending from the first display area D1 and forming the curved shape with a certain radius of curvature. Accordingly, an image may be viewed by a user on the first display area D1 as well as the extended display screen, i.e., the second display areas D2, leading to an expansion of the entire display screen.

If the flexible display panel 300 is provided in a small handheld display device, such as a cellular phones or a PDA, the comfort in terms of grip and the aesthetic sense of the display device may be improved because the second display areas D2 are formed as a curved shape.

Areas among the non-display areas NA that are located outside the second display areas D2 are folded opposite to the glass substrate 310. Thus, the non-display areas of the display device may be minimized.

The embodiment shows an example of folding only the non-display areas disposed on lateral sides of the second display areas D2. In the case where the entire non-display area NA is formed on the flexible substrate 310, the entire non-display area NA may be folded opposite to the glass substrate 310. This leads to the non-display area NA being even more reduced and having a narrow bezel, thus resulting in a more expanded display screen.

Figure 22:
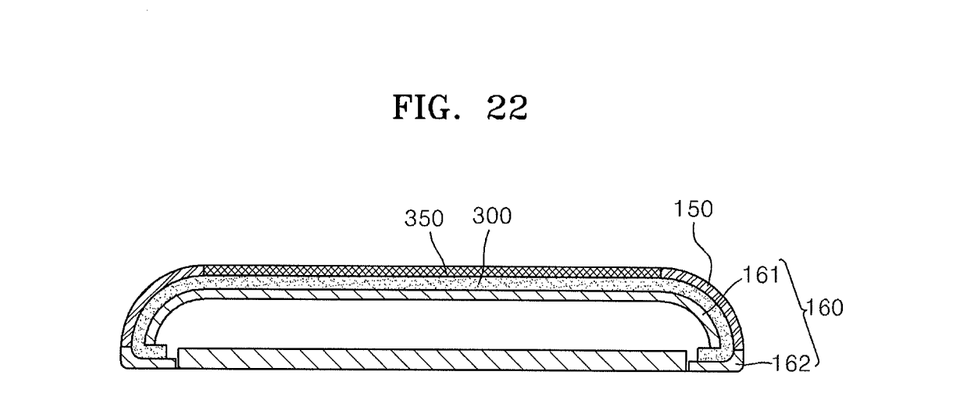
Figure 23:
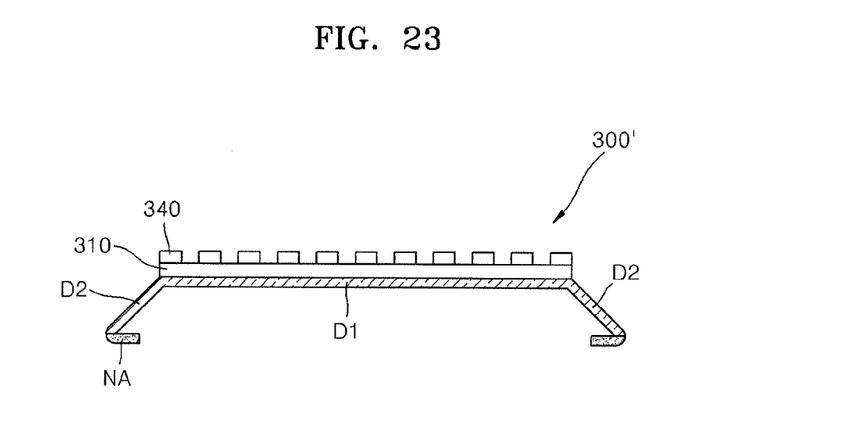

Referring to FIG. 22, the flexible display panel 300 is incorporated into a display device (not shown). The display device may include a frame or housing 160 to protect and support the display panel. The flexible display panel 300 of the embodiment is attached onto the top of the front case 161 of the housing 160, with the non-display area NA of the flexible display panel 300 being folded and safely received between the front case 161 and the bottom case 162 so as to prevent the non-display area NA from being viewed and recognized. A transparent touch panel substrate 350 that faces transparent electrode patterns 340 lies on the front side of the first display area D1 of the flexible display panel 300; and a transparent protective window 150 lies on the front side(surface) of the second display areas D2. The window 150 may act not only as a protector of the flexible display panel 300 from an outside shock, but also as a supporter to maintain the shape of the flexible display panel 300.

In the current embodiment, the first display area D1 is implemented as a touch screen by disposing the touch panel substrate 350 in the first display area D1. The touch panel substrate 350 may be a transparent substrate in which the window is integrated. Accordingly, compared with a conventional touch panel display device in which a separate window is disposed on a touch panel, the touch panel according to the embodiment has no need to have an additional window, which leads to reduction of thickness of the display device and thus, an improved sense of touching. The touch panel substrate 350 is disposed over the transparent electrode pattern 340 of the glass substrate 310 in the first display area D1. The touch panel substrate 350 may include a transparent electrode layer on a side opposite to the transparent electrode pattern 340, so as to detect touches based on a capacitance variance with the transparent electrode patterns 340. In other implementations, the touch panel substrate 350 have a window function to cover the transparent electrode pattern 340 and detect touches based on capacitance variance between the transparent electrode pattern 340 and sensing elements of the light emitting unit. Other touch methods, such as resistive methods may also be employed.

Figure 24:
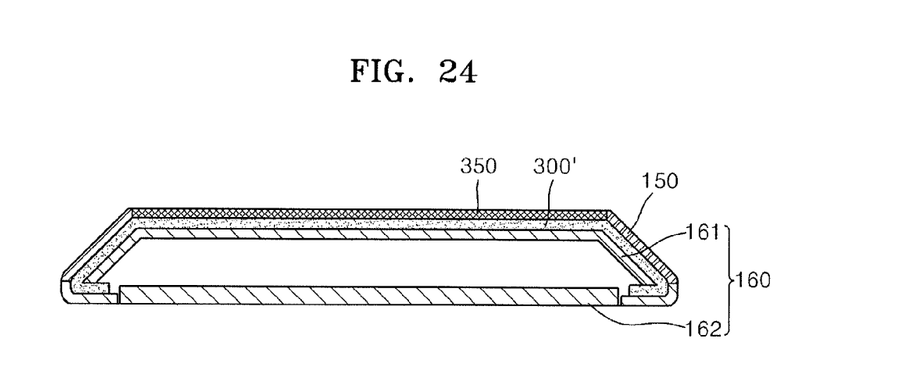

FIGS. 21 and 22 show the second display area D2 having a curved shape. In other implementations, as shown, for example, in FIG. 23, a display panel 300' may be formed such that the second display area D2 has a flat shape. From the border between the first display area D1 and the second display area D2, the second display area D2 may be folded at a predetermined angle in a direction opposite to the glass substrate 310, to have the flat shape. In this case, as shown in FIG. 24, the areas of the front case 161 of the housing 160 that correspond to the second display areas D2 may also have the flat shape and support to maintain the shape of the display panel 300'.

FIGS. 18, 20, 22, and 24 merely show an example of the flexible display panel combined with the display device. Naturally, various modifications thereof could be made by one of ordinary skill in the art. The foregoing embodiments have taken the area-split flexible display panel divided into two display areas as an example; however, in other implementations, a flexible display panel may be divided into more than two areas by selectively forming the flexible areas in more than two display areas. Furthermore, the second display area D2 is not limited to be in a left/right direction of the first display area D1, but may be positioned in an upward/downward direction or in any other direction with respect to the first display area D1.

As such, the area-split flexible display panel in which a portion of the display area has a curved shape or is folded at a predetermined angle while maintaining a flat shape may be incorporated into various display devices, such as televisions, computer monitors, personal digital assistants (PDAs), smart devices, etc. Accordingly, a non-display area recognized by a user who uses the display device may be noticeably reduced, thus providing a more expanded image screen compared to conventional display devices. In addition, the applicability of the display device may be enhanced by dividing the display area into flexible and non-flexible areas and folding the flexible area in various ways.

According to embodiments, a display device having an area-split flexible display panel that includes two or more areas having a flexible structure or a non-flexible rigid structure is provided, and benefits of the two structures lead to enhanced device applicability. Embodiments may provide a flexible display panel and a display device having the display panel to address a problem with conventional display devices having a display panel formed on thin plastic, which could lead to low reliability against heat and moisture and difficulty in applying an integrated touch screen panel therein, compared with a display device having a display panel formed on a glass substrate.

While embodiments have been particularly shown and described with reference to exemplary embodiments thereof, it will be understood by those of ordinary skill in the art that various changes in form and details may be made therein without departing from the spirit and scope as defined by the following claims.

What is claimed is:

1. A flexible display panel, comprising:
a non-flexible first substrate in a first display area;
a flexible second substrate in a second display area;
a light emitting unit on a side of the first and second substrates; and
a thin film encapsulation member on the light emitting unit.

2. The flexible display panel of claim 1, wherein:
the first display area has a flat shape, and
the second display area has a curved shape with a predetermined curvature from a boundary with the first display area toward the first substrate.

3. The flexible display panel of claim 1, wherein:
the first display area has a flat shape, and
the second display area has a flat shape, the second display area being at a predetermined angle from a boundary with the first display area toward the first substrate.

4. The flexible display panel of claim 1, wherein the first display area further includes a transparent electrode pattern on another side of the first substrate.

5. The flexible display panel of claim 4, wherein:
the first display area has a flat shape, and
the second display area has a curved shape with a predetermined curvature from a boundary with the first display area toward a side away from the first substrate.

6. The flexible display panel of claim 4, wherein:
the first display area has a flat shape, and
the second display area has a flat shape, the second display area being folded at a predetermined angle from a boundary with the first display area toward a side away from the first substrate.

7. A flexible display panel, comprising
a first display area including a non-flexible first substrate, a first light emitting unit on a side of the first substrate, and a first thin film encapsulation member on the first light emitting unit; and
a second display area including a flexible second substrate, a second light emitting unit on a side of the second substrate, and a second thin film encapsulation member on the second light emitting unit.

8. The flexible display panel of claim 7, wherein the second substrate is formed at a same level as the first light emitting unit.

9. The flexible display panel of claim 7, wherein:
the first display area has a flat shape, and
the second display area has a curved shape with a predetermined curvature from a boundary with the first display area toward the first substrate.

10. The flexible display panel of claim 7, wherein:
the first display area has a flat shape, and
the second display area has a flat shape, the second display area being folded at a predetermined angle from a boundary with the first display area toward the first substrate.

11. The flexible display panel of claim 7, wherein the first display area further includes a transparent electrode pattern on another side of the first substrate.

12. The flexible display panel of claim 11, wherein:
the first display area has a first flat shape, and
the second display area has a curved shape with a predetermined curvature from a boundary with the first display area toward a side away from the first substrate, or has a second flat shape and is folded at a predetermined angle from the boundary with the first display area toward the side away from the first substrate.

13. The flexible display panel of claim 7, wherein the first thin film encapsulation member is thicker than the second thin film encapsulation member, with the first and second thin film encapsulation members being flat without any step height therebetween.

14. A display device, comprising:
a flexible display panel having a non-flexible first substrate in a first display area, a flexible second substrate in a second display area, a light emitting unit on a side of the first and second substrates, and a thin film encapsulation member on the light emitting unit, and
a supporting member to support the shape of the flexible display panel.

15. The display device of claim 14, wherein:
the first display area has a first flat shape, and
the second display area has a curved shape with a predetermined curvature from a boundary with the first display area toward the first substrate, or has a second flat shape and is folded at a predetermined angle from the boundary with the first display area toward the first substrate.

16. The display device of claim 14, wherein the first display area further includes:
   a transparent electrode pattern on another side of the first substrate, and
   a third substrate that covers the transparent electrode pattern and forms a touch screen.

17. The display device of claim 16, wherein:
the first display area has a first flat shape, and
the second display area has a curved shape with a predetermined curvature from a boundary with the first display area toward a side away from the first substrate, or has a second flat shape and is folded at a predetermined angle from the boundary with the first display area toward the side away from the first substrate.

18. A method of manufacturing a display device, the method comprising:
   selectively forming a flexible substrate on one side of a supporting substrate;
   forming a light emitting unit having light emitting devices on the supporting substrate, both in an area in which the flexible substrate is not formed, and on the flexible substrate;
   forming a thin film encapsulation member that encapsulates the light emitting unit; and
   separating a part of the supporting substrate in an area in which the flexible substrate is formed from the flexible substrate, thereby providing a flexible display panel, comprising:
   a non-flexible first substrate in a first display area;
   a flexible second substrate in a second display area;
   a light emitting unit on a side of the first and second substrates; and
   a thin film encapsulation member on the light emitting unit.

19. The method of claim 18, further comprising forming a transparent electrode pattern on another side of the supporting substrate in an area in which the flexible substrate is not to be formed, before forming the flexible substrate.

20. The method of claim 18, further comprising curving the second display area with a predetermined curvature or folding the second display area at a predetermined angle, from a boundary between a first display area in which the flexible substrate is not formed and a second display area in which the flexible substrate is formed.

* * * * *